(12) United States Patent
Sasaki et al.

(10) Patent No.: US 10,461,100 B2
(45) Date of Patent: Oct. 29, 2019

(54) DISPLAY DEVICE HAVING A DIFFERENT TYPE OF OXIDE SEMICONDUCTOR TRANSISTOR

(71) Applicant: Japan Display Inc., Tokyo (JP)

(72) Inventors: Toshinari Sasaki, Tokyo (JP); Marina Shiokawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/953,614

(22) Filed: Apr. 16, 2018

(65) Prior Publication Data

US 2018/0331127 A1 Nov. 15, 2018

(30) Foreign Application Priority Data

May 15, 2017 (JP) .................. 2017-096378

(51) Int. Cl.
  *H01L 27/12* (2006.01)
  *H01L 29/786* (2006.01)
  *H01L 29/24* (2006.01)
  *H01L 29/66* (2006.01)

(52) U.S. Cl.
  CPC ........ *H01L 27/1225* (2013.01); *H01L 27/127* (2013.01); *H01L 27/1251* (2013.01); *H01L 27/1255* (2013.01); *H01L 29/24* (2013.01); *H01L 29/66969* (2013.01); *H01L 29/7869* (2013.01); *H01L 29/78633* (2013.01)

(58) Field of Classification Search
  CPC ............. H01L 27/1214; H01L 27/1222; H01L 27/1225; H01L 27/1255; H01L 29/7869
  USPC ........................................................ 257/43
  See application file for complete search history.

(56) References Cited

U.S. PATENT DOCUMENTS

| 2010/0176383 | A1* | 7/2010 | Park ................... H01L 27/3262 257/40 |
| 2013/0001558 | A1 | 1/2013 | Okada et al. |
| 2015/0153599 | A1* | 6/2015 | Yamazaki .......... H01L 27/1225 257/43 |

FOREIGN PATENT DOCUMENTS

| JP | 2013012603 A | 1/2013 |
| JP | 2017028298 A * | 2/2017 ......... H01L 27/1225 |

* cited by examiner

*Primary Examiner* — Matthew E Warren
(74) *Attorney, Agent, or Firm* — Michael Best & Friedrich LLP

(57) ABSTRACT

A semiconductor device including a substrate, a first insulating layer above the substrate, a first transistor including a first oxide semiconductor layer above the first insulating layer, and a second transistor including a second oxide semiconductor layer above the first insulating layer, a composition of the second oxide semiconductor layer being different from a composition of the first oxide semiconductor layer.

8 Claims, 18 Drawing Sheets

FIG. 17

| Etchant | unit | Second oxide semiconductor | | First oxide semiconductor | |
|---|---|---|---|---|---|
| | | asdepo. | 350degC ANL | asdepo. | 350degC ANL |
| 0.5% HF | [nm/sec] | > 10 | 6.4 | > 10 | 7.1 |
| Phosphoric acid | [nm/min] | 32.0 | 22.2 | 2.5 | ~0 |
| BHF | [nm/sec] | > 10 | > 10 | > 10 | > 10 |
| Peeling solution | [nm/min] | 0.8 | 0.7 | 0.2 | 0.3 |
| Oxalic acid | [nm/min] | 21.0 | 11.8 | 23.0 | 17.7 |

FIG. 18
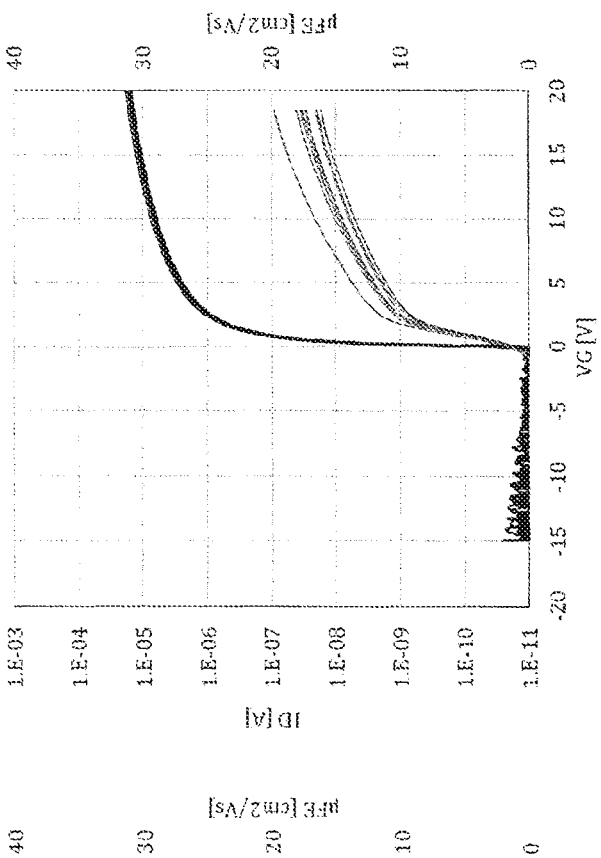
First transistor
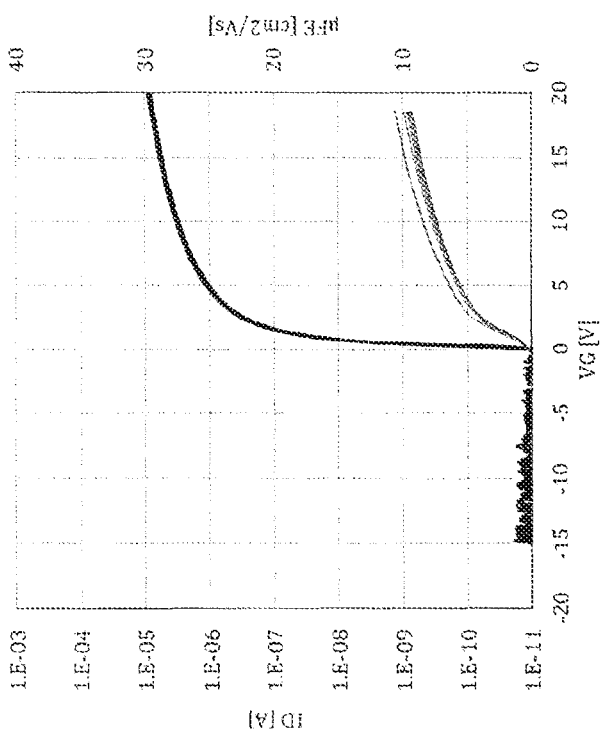
Second transistor

DISPLAY DEVICE HAVING A DIFFERENT TYPE OF OXIDE SEMICONDUCTOR TRANSISTOR

CROSS REFERENCE TO RELATED APPLICATIONS

This application is based upon and claims the benefit of priority from the prior Japanese Patent Application No. 2017-096378 filed on May 15, 2017, the entire contents of which are incorporated herein by reference.

FIELD

One embodiment of the present invention is related to a semiconductor device and display device. One embodiment of the present invention is related to a semiconductor device and display device in which an oxide semiconductor layer is used as a semiconductor layer.

BACKGROUND

In recent years, the development of semiconductor devices which use an oxide semiconductor for a channel in place of amorphous silicon, low temperature polysilicon and single crystal silicon has been proceeding (for example, Japanese Laid Open Patent Publication No. 2013-012603). A semiconductor device which uses an oxide semiconductor as a channel can be formed with a simple structure and at a low temperature process similar to a semiconductor device which uses amorphous silicon as a channel. It is known that a semiconductor device which uses an oxide semiconductor as a channel has higher mobility than a semiconductor device which uses amorphous silicon as a channel. It is known that a semiconductor device which uses an oxide semiconductor as a channel has a low off-current.

For example, an oxide semiconductor represented by an oxide semiconductor (In—Ga—Zn—O) including indium (In), gallium (Ga), zinc (Zn) and oxygen (O) has a band gap of 3.0 eV or more. Furthermore, the oxide semiconductor is transparent in the visible light region. Therefore, when a semiconductor device in which an oxide semiconductor is used for a channel is applied to a display device, the display device is hardly affected by light such as a backlight, and hardly causes malfunctions.

In a general display device, a transistor structure of a pixel circuit for displaying an image is a structure which is easily affected by light. On the other hand, a transistor structure of a drive circuit for driving a pixel circuit is a structure which is hardly affected by light. Therefore, in the case when a transistor including an oxide semiconductor is used for a display device, it is preferred to use an oxide semiconductor which has a large band gap and is hardly affected by light as a transistor of a pixel circuit. On the other hand, it is preferred to use an oxide semiconductor which has high mobility as a transistor of the drive circuit. In order to satisfy these conditions, oxide semiconductors which have different materials are used for each of a transistor of a pixel circuit and a transistor of a driver circuit. However, oxide semiconductors have a low chemical resistance to acid compared to silicon. As a result, it is difficult to manufacture a plurality of transistors in which oxide semiconductors having different materials are used for a channel.

SUMMARY

A semiconductor device in an embodiment according to the present invention includes a substrate, a first insulating layer above the substrate, a first transistor including a first oxide semiconductor layer above the first insulating layer, and a second transistor including a second oxide semiconductor layer above the first insulating layer, a composition of the second oxide semiconductor layer being different from a composition of the first oxide semiconductor layer.

A display device in an embodiment according to the present invention includes a display circuit provided with a plurality of pixel circuits in a matrix shape, a drive circuit provided in a periphery of the display circuit, the drive circuit driving each of the plurality of pixel circuits, a first transistor having a first oxide semiconductor layer as a channel, the first transistor being included in the drive circuit, and a second transistor having a second oxide semiconductor layer as a channel, the second transistor being included in the pixel circuit, and a composition of the first oxide semiconductor layer is different from a composition of the second oxide semiconductor layer.

BRIEF DESCRIPTION OF DRAWINGS

FIG. 17 is a diagram showing an etchant rate of a first oxide semiconductor layer and a second oxide semiconductor layer according to one embodiment of the present invention; and FIG. 18 is a diagram showing electrical properties of a first transistor and a second transistor according to one embodiment of the present invention.

DESCRIPTION OF EMBODIMENTS

Figure 1:
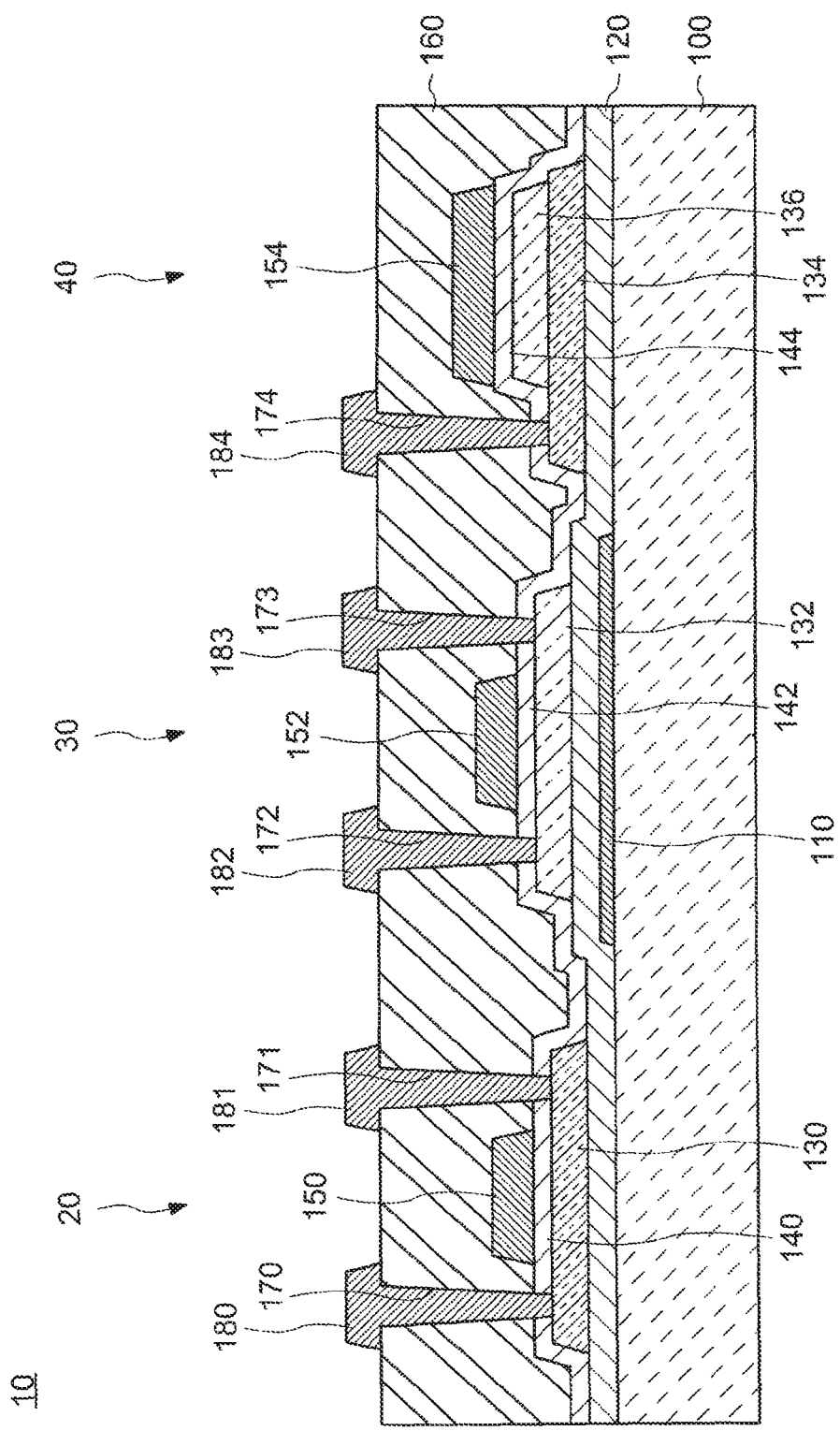
FIG. 1 is a cross-sectional diagram showing an outline of a semiconductor device according to one embodiment of the present invention.

Each embodiment of the present invention is explained below while referring to the drawings. Furthermore, the disclosure is merely an example, and those skilled in the art can of course easily conceive of changes in keeping with the concept of the invention which are included in the scope of the present invention. Although the drawings may be schematically represented in terms of the width, thickness and shape and the like of each part as compared with the actual form in order to make explanation clearer, the drawings are only an example and an interpretation of the present invention is not limited thereto. In addition, in the present specification and each drawing, elements similar to those described with reference to the preceding drawings may be attached with the same reference symbols followed by a letter of the alphabet and a detailed explanation thereof may be omitted as appropriate. An object of the following embodiments is to provide a semiconductor device and a display device. One embodiment below aims to provide a semiconductor device and a display device in which oxide semiconductors having different materials are used for channels in each of a plurality of transistors.

First Embodiment

An outline of a semiconductor device 10 according to the first embodiment of the present invention is explained while referring to FIG. 1 to FIG. 6. The semiconductor device 10 includes a plurality of transistors. Oxide semiconductors having different materials are used for the channels of each of the plurality of transistors. The semiconductor device 10 is used in a liquid crystal display device (LCD), a self-light emitting display device using a self-light emitting element such as an organic EL element (Organic Light-Emitting Diode: OLED) or a quantum dot or the like in a display part, or a reflection type display device such as electronic paper. The semiconductor device 10 is used in each of the pixels or the drive circuits of the display devices.

However, the semiconductor device 10 is not limited to a semiconductor device used in a display device. For example, the semiconductor device 10 may also be used in an integrated circuit (IC) such as a microprocessor (MPU).

[Structure of Semiconductor Device 10]

FIG. 1 is a cross-sectional view showing an outline of a semiconductor device according to one embodiment of the present invention. As is shown in FIG. 1, the semiconductor device 10 includes a substrate 100, a light shielding layer 110, an underlying insulating layer 120, a first transistor 20, a second transistor 30, and a capacitor 40. The light shielding layer 110 and the underlying insulating layer 120 are provided above the substrate 100. The light shielding layer 110 is provided with respect to the second transistor 30. Specifically, the light shielding layer 110 is provided at a position overlapping with a second oxide semiconductor layer 132 in a channel region of the second oxide semiconductor layer 132 of the second transistor 30 in a planar view. The light shielding layer 110 is provided between the substrate 100 and the underlying insulating layer 120. The first transistor 20, the second transistor 30, and the capacitor 40 are respectively in contact with the underlying insulating layer 120 above the underlying insulating layer 120.

The first transistor 20 includes a first oxide semiconductor layer 130, a first gate insulating layer 140, and a first gate electrode 150. The first transistor 20 is a top gate type transistor. The first oxide semiconductor layer 130 is in contact with the underlying insulating layer 120 above the underlying insulating layer 120. The first gate electrode 150 faces the first oxide semiconductor layer 130. The first gate insulating layer 140 is provided between the first oxide semiconductor layer 130 and the first gate electrode 150. The first gate insulating layer 140 is in contact with the first oxide semiconductor layer 130 above the first oxide semiconductor layer 130. The first transistor 20 is a transistor in which the first oxide semiconductor layer 130 serves as a channel.

The second transistor 30 includes a second oxide semiconductor layer 132, a second gate insulating layer 142, and a second gate electrode 152. The second transistor 30 is a top gate type transistor. The second oxide semiconductor layer 132 is in contact with the underlying insulating layer 120 above the underlying insulating layer 120. The second gate electrode 152 faces the second oxide semiconductor layer 132. The second gate insulating layer 142 is provided between the second oxide semiconductor layer 132 and the second gate electrode 152. The second gate insulating layer 142 is in contact with the second oxide semiconductor layer 132 above the second oxide semiconductor layer 132. The second transistor 30 is a transistor in which the second oxide semiconductor layer 132 serves as a channel. The composition of the second oxide semiconductor layer 132 is different from the composition of the first oxide semiconductor layer 130.

The capacitor element 40 includes a third oxide semiconductor layer 134, a fourth oxide semiconductor layer 136, a dielectric body 144, and a capacitor electrode 154. The third oxide semiconductor layer 134 is an oxide semiconductor layer having the same composition and being arranged in the same layer as the first oxide semiconductor layer 130. The fourth oxide semiconductor layer 136 is an oxide semiconductor layer having the same composition and being arranged in the same layer as the second oxide semiconductor layer 132. The third oxide semiconductor layer 134 is in contact with the underlying insulating layer 120 above the underlying insulating layer 120. The fourth oxide semiconductor layer 136 is in contact with the third oxide semiconductor layer 134 above the third oxide semiconductor layer 134. In a planar view, a pattern of the fourth oxide semiconductor layer 136 is different from a pattern of the third oxide semiconductor layer 134. The capacitor electrode 154 faces the fourth oxide semiconductor layer 136. The dielectric body 144 is provided between the fourth oxide semiconductor layer 136 and the capacitor electrode 154. The dielectric body 144 is in contact with the fourth oxide semiconductor layer 136 above the fourth oxide semiconductor layer 136. The capacitor 40 is a capacitor element, and one electrode of the capacitor element corresponds to the third oxide semiconductor layer 134 and the fourth oxide semiconductor layer 136. In other words, one electrode of the capacitor 40 is a stacked oxide semiconductor layer. The stacked oxide semiconductor layer includes the third oxide semiconductor layer 134 and the fourth oxide semiconductor layer 136.

As described above, the first oxide semiconductor layer 130, the second oxide semiconductor layer 132, and the third oxide semiconductor layer 134 are each in contact with a lower underlying insulating layer 120 respectively. The first oxide semiconductor layer 130, the second oxide semiconductor layer 132 and the fourth oxide semiconductor layer 136 are each in contact with an upper first gate insulating layer 140, the second gate insulating layer 142 and the dielectric body 144 respectively. Since the first gate insulating layer 140, the second gate insulating layer 142, and the dielectric body 144 are the same layer, it can be said that the first oxide semiconductor layer 130, the second oxide semiconductor layer 132 and the fourth oxide semiconductor layer 136 are in contact with the same insulation layer.

The semiconductor device 10 further includes an interlayer insulating layer 160, a first source electrode 180, a first drain electrode 181, a second source electrode 182, a second drain electrode 183 and wiring 184. The interlayer insulating layer 160 is provided above the first transistor 20, the second transistor 30 and the capacitor 40. The interlayer insulating layer 160 is in contact with the first transistor 20, the second transistor 30 and the capacitor 40. First openings 170 and 171, second openings 172 and 173, and a third opening 174 are provided in the interlayer insulating layer 160. The first source electrode 180 and the first drain electrode 181 are respectively connected to the first oxide semiconductor layer 130 in a source region and a drain region through the first openings 170 and 171. The second source electrode 182 and the second drain electrode 183 are respectively connected to the second oxide semiconductor layer 132 in a source region and a drain region through the second openings 172 and 173. The wiring 184 is connected to the third oxide semiconductor layer 134 which is exposed from the fourth oxide semiconductor layer 136 through the third opening 174.

Although a structure in which the semiconductor device 10 includes the capacitor 40 is exemplified in FIG. 1, the semiconductor device 10 only needs to include at least the first transistor 20 and the second transistor 30, and is not required to include the capacitor 40. Similarly, although a structure in which the light shielding layer 110 is provided with respect to the second transistor 30 is exemplified in FIG. 1, the light shielding layer 110 may not be provided. Reversely, a light shielding layer similar to the light shielding layer 110 may be provided for the first transistor 20 and the capacitor 40.

[Material of Each Member]

An insulating substrate containing a resin such as a polyimide substrate, an acrylic substrate, a siloxane substrate or a fluorine resin substrate can be used as the substrate 100. Impurities may be introduced into the substrate in order to improve heat resistance of the substrate 100. In particular, in the case when the semiconductor device 10 is a top emission type display, it is not necessary that the substrate 100 be transparent. Therefore, the substrate 100 may contain impurities that deteriorate transparency. On the other hand, in the case when it is not necessary for the substrate 100 to have flexibility, a translucent insulating substrate such as a glass substrate, a quartz substrate or a sapphire substrate can be used as the substrate 100. In the case where the semiconductor device 10 is used for an integrated circuit which is not a display device, semiconductor substrates such as a silicon substrate, a silicon carbide substrate or a compound semiconductor substrate, or a conductive substrate such as a stainless substrate or a substrate which does not have translucency can be used as the substrate 100.

It is possible to use a material which absorbs light in the visible light region as the light shielding layer 110. For example, it is possible to use a black resin or chrome (Cr) as the light shielding layer 110.

It is possible to use an oxide insulator such as silicon oxide ($SiO_x$), silicon oxynitride ($SiO_xN_y$), silicon nitride oxide ($SiN_xO_y$), silicon nitride ($SiN_x$), aluminum oxide ($AlO_x$), aluminum oxide nitride ($AlO_xN_y$), aluminum nitride oxide ($AlN_xO_y$), aluminum nitride ($AlN_x$), or the like as the underlying insulating layer 120 (x and y are arbitrary positive numerical values). Alternatively, the underlying insulating layer 120 may have a structure including a stack of films of such materials. Instead of the above-listed inorganic insulating materials, the underlying insulating layer 120 may be formed of a TEOS layer or an organic insulating material.

$SiO_xN_y$ and $AlO_xN_y$ explained above are a silicon compound and an aluminum compound containing a less amount of nitrogen (N) than oxygen (O). $SiN_xO_y$ and $AlN_xO_y$ are a silicon compound and an aluminum compound containing less oxygen than nitrogen. The TEOS layer refers to a CVD layer which uses TEOS (Tetra Ethyl Ortho Silicate) as a raw material.

Examples of the usable organic insulating material include a polyimide resin, an acrylic resin, an epoxy resin, a silicone resin, a fluorine resin, a siloxane resin, and the like. The underlying insulating layer 120 may be formed of a single layer or a stack of films of such materials. For example, the underlying insulating layer 120 may include a stack of an inorganic insulating material and an organic insulating material.

A metal oxide including tin (Sn) is used as the first oxide semiconductor layer 130. For example, it is possible to use In—Ga—Zn—Sn—O including Sn as the composition of the first oxide semiconductor layer 130. More specifically, it is possible to use In—Ga—Zn—Sn—O including 1% or more of Sn as the first oxide semiconductor layer 130. Preferably, it is possible to use In—Ga—Zn—Sn—O including 5% or more of Sn as the first oxide semiconductor layer 130. More preferably, it is possible to use In—Ga—Zn—Sn—O including 10% or more of Sn as the first oxide semiconductor layer 130. In the first oxide semiconductor layer 130, the content ratio of Sn may be higher than the content ratio of any of In, Ga, and Zn. The material of the third oxide semiconductor layer 134 is the same as the material of the first oxide semiconductor layer 130. While the first oxide semiconductor layer 130 includes Sn, the second oxide semiconductor layer 132 which is described later does not include Sn, or the Sn content ratio of the second oxide semiconductor layer 132 is smaller than that of the first oxide semiconductor layer 130. Therefore, the etching resistance of the first oxide semiconductor layer 130 with respect to phosphoric acid is higher than the etching resistance with respect to phosphoric acid of the second oxide semiconductor layer 132.

In addition to In—Ga—Zn—Sn—O, it is possible to use In—Al—Zn—Sn—O, In—Ga—Al—Sn—O, In—Ga—Sn—O, In—Zn—Sn—O, and Zn—Ga—Sn—O as the first oxide semiconductor layer 130.

The band gap of the first oxide semiconductor layer 130 may be smaller than 3.0 eV. That is, the first oxide semiconductor layer 130 may have an absorption band in the visible light region. Since the first oxide semiconductor layer 130 includes Sn, it has etching resistance against acids such as phosphoric acid and hydrofluoric acid for example. For example, the etching rate for the first oxide semiconductor layer 130 with respect to phosphoric acid is ⅕ or less compared to the etching rate for the second oxide semiconductor layer 132 described later with respect to the phosphoric acid described above. Preferably, the ratio of the etching rate may be 1/10 or less. More preferably, the ratio of the etching rate may be 1/20 or less. The ratio of the etching rate may be the ratio of the etching rate for oxide semiconductor layer immediately after deposition (as-depo), or the ratio of the etching rate after heat treatment (for example, after heat treatment at 350° C.). The ratio of the etching rate may be the ratio of the etching rate with respect to [chemical solution including nitric acid=8 to 10%, phosphoric acid=60 to 70%, acetic acid=2 to 5%, inorganic additive (NI-14F and the like)<1%, and water]. The first oxide semiconductor layer 130 used in the present embodiment is soluble in oxalic acid and can be etched using oxalic acid.

A material which has a lower Sn content ratio than that of the first oxide semiconductor layer 130 is used as the second oxide semiconductor layer 132. The second oxide semiconductor layer 132 may also be an oxide semiconductor layer which does not include Sn. In—Ga—Zn—O having a composition ratio of In:Ga:Zn:0=1:1:1:4 can be used as the second oxide semiconductor layer 132. However, the composition of In—Ga—Zn—O used in the present invention is not limited to the composition described above and In—Ga—Zn—O having a composition different from the composition described above can also be used. For example, the ratio of In may be increased more than the ratio described above in order to improve mobility. On the other hand, the ratio of Ga may be increased more than the ratio described above in order to reduce the influence of light irradiation by increasing the band gap. The material of the fourth oxide semiconductor layer 136 is the same as the material of the second oxide semiconductor layer 132.

In addition to In—Ga—Zn—O, it is possible to use In—Al—Zn—O, In—Ga—Al—O, In—Ga—O, In—Zn—O, and Zn—Ga—O as the second oxide semiconductor layer 132. The band gap of the second oxide semiconductor layer 132 may be 3.0 eV or more. That is, it is not necessary that the second oxide semiconductor layer 132 have an absorption band in the visible light region. The second oxide semiconductor layer 132 is soluble in acids (oxalic acid, phosphoric acid, hydrofluoric acid and the like).

The first oxide semiconductor layer 130 and the second oxide semiconductor layer 132 may be amorphous or crystalline. The first oxide semiconductor layer 130 and the second oxide semiconductor layer 132 may also be a mixed phase of amorphous and crystal. A field effect mobility of the first oxide semiconductor layer 130 is higher than a field effect mobility of the second oxide semiconductor layer 132.

An inorganic insulating material such as $SiO_x$, $SiO_xN_y$, $SiN_x$, $SiN_xO_y$, $AlO_x$, $AlO_xN_y$, $AlN_x$ and $AlN_xO_y$ or the like can be used as the first gate insulating layer 140. A structure in which the insulating layers described above are stacked can be used as the first gate insulating layer 140. Materials of the second gate insulating layer 142 and the dielectric body 144 is the same with a material of the first gate insulating layer 140.

For example, a metal such as aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt) or bismuth (Bi) and the like can be used as the first gate electrode 150. An alloy of these materials may be used, or a nitride of these materials may be used as the first gate electrode 150. A conductive oxide material such as ITO (indium tin oxide), IGO (indium gallium oxide), IZO (indium zinc oxide), GZO (zinc oxide added with gallium as a dopant) may be used as the first gate electrode 150. Materials of the second gate electrode 152 and the capacitor electrode 154 is the same with a material of the first gate electrode 150.

It is preferred to use a material which has a work function that becomes an enhancement type in which a transistor is switched OFF when 0 V is applied to the first gate electrode 150 and the second gate electrode 152 as a material used as the first gate electrode 150 and the second gate electrode 152.

An inorganic insulating material such as $SiO_x$, $SiO_xN_y$, $AlO_x$, $AlO_xN_y$, and a TEOS layer or the like can be used as the interlayer insulating layer 160. In addition to the inorganic insulating materials described above, an organic insulating material can be used as the interlayer insulating layer 160. Polyimide resin, acrylic resin, epoxy resin, silicone resin, fluororesin or siloxane resin and the like can be used as the organic insulating material 160. A structure in which the insulating layers described above are stacked may also be used as the interlayer insulating layer 160.

Similar to the first gate electrode 150, Al, Ti, Cr, Co, Ni, Zn, Mo, In, Sn, Hf, Ta, W, Pt and Bi or the like can be used as the first source electrode 180. The material of the first drain electrode 181, the second source electrode 182, the second drain electrode 183 and the wiring 184 is the same as the material of the first source electrode 180.

Figure 2:
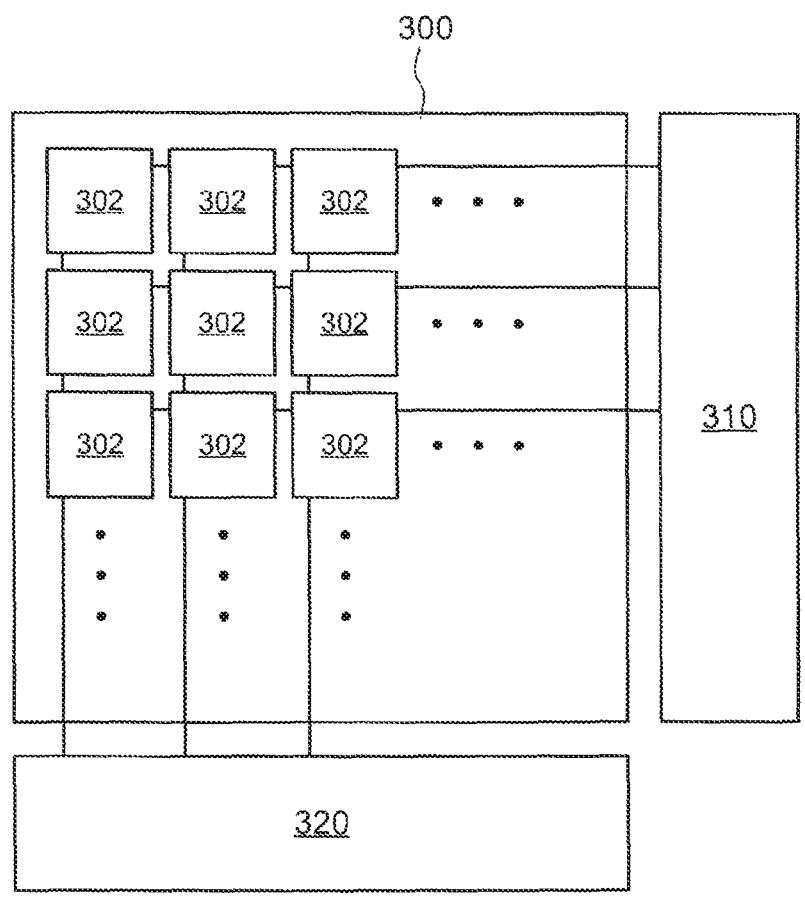
FIG. 2 is a block diagram showing an outline of a display device according to one embodiment of the present invention.

FIG. 2 is a block diagram showing an outline of a display device according to one embodiment of the present invention. The display device 50 shown in FIG. 2 is a display device using the semiconductor device 10 shown in FIG. 1. The display device 50 includes a display circuit 300, a gate line drive circuit 310 and a source line drive circuit 320. The display circuit 300 has a plurality of pixel circuits 302. The plurality of pixel circuits 302 are arranged in a matrix shape. The gate line drive circuit 310 and the source line drive circuit 320 are provided in the periphery region of the display circuit 300. These drive circuits drive each of the plurality of pixel circuits 302. The second transistor 30 and the capacitor 40 are used in the pixel circuit 302. The first transistor 20 is used in the gate line drive circuit 310 and the source line drive circuit 320.

Since the field-effect mobility of the first oxide semiconductor layer 130 is higher than the field-effect mobility of the second oxide semiconductor layer 132, in the case when the first transistor 20 and the second transistor 30 are driven under the same conditions, the ON current of the first transistor 20 is larger than the ON current of the second transistor 30. Therefore, for example, the first transistor 20 can be used for a drive circuit of the display device and the second transistor 30 can be used for a pixel circuit. By adopting such a structure, it is possible to achieve both a pixel circuit which is not easily affected by light and a drive circuit having a high driving capability.

[Manufacturing Method of Semiconductor Device 10]

Figure 3:
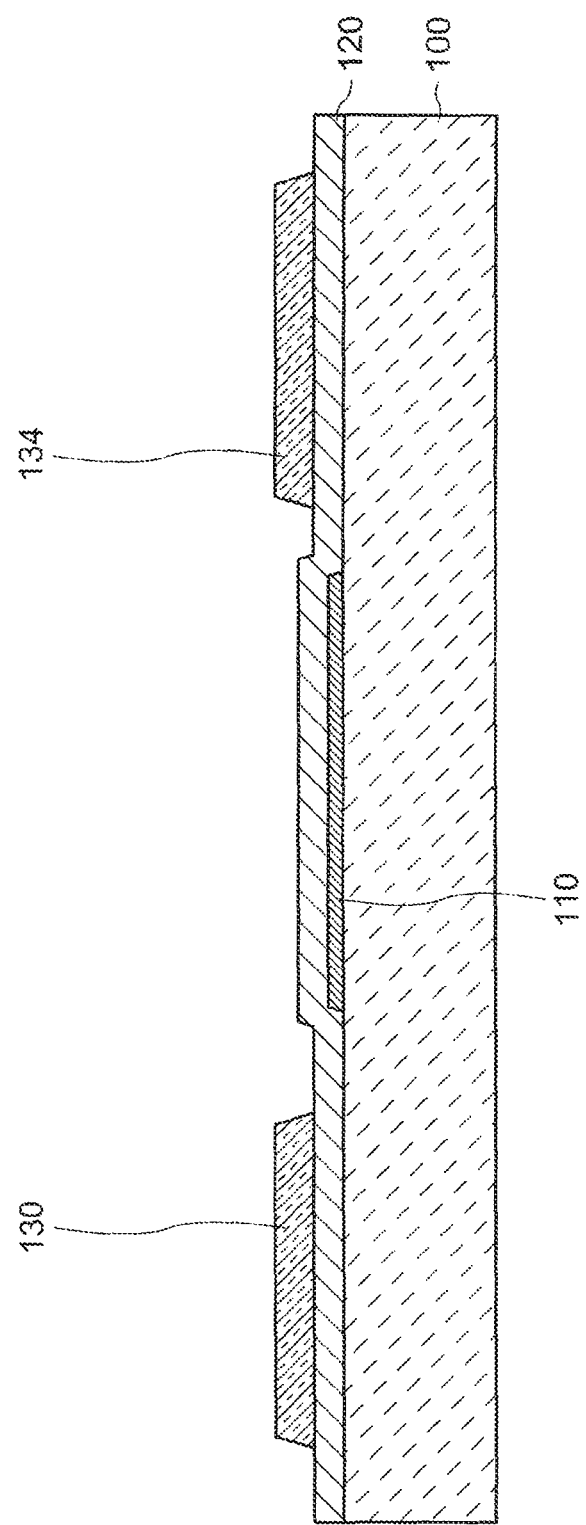
FIG. 3 is a cross-sectional diagram showing a process for forming a first oxide semiconductor layer and a third oxide semiconductor layer in a manufacturing method of a semiconductor device according to one embodiment of the present invention.

A method of manufacturing the semiconductor device 10 according to the first embodiment of the present invention is explained while referring to the cross-sectional views in FIG. 3 to FIG. 6. FIG. 3 is a cross-sectional diagram showing a process for forming a first oxide semiconductor layer and a third oxide semiconductor layer in the method of manufacturing a semiconductor device according to one embodiment of the present invention. As is shown in FIG. 3, the light shielding layer 110 and the underlying insulating layer 120 are formed above the substrate 100. The first oxide semiconductor layer 130 and the third oxide semiconductor layer 134 are formed above the underlying insulating layer 120.

It is possible to form the first oxide semiconductor layer 130 and the third oxide semiconductor layer 134 by a physical vapor deposition (PVD) method. A sputtering method, a vacuum evaporation method, an electron beam evaporation method or a molecular beam epitaxy method or the like is used as the PVD method. In the present embodiment, a film of In—Ga—Zn—Sn—O is formed as the first oxide semiconductor layer 130 and the third oxide semiconductor layer 134 by a sputtering method. Etching of these oxide semiconductor layers is performed by wet etching. An etchant containing oxalic acid is used as an etchant used for the wet etching. For example, a [chemical solution in which a surfactant is added to water with 5% of oxalic acid] is used as the etchant including oxalic acid. Since the underlying insulating layer 120 has etching resistance to the above etchant, it functions as an etching stopper for the oxide semiconductor layer described above.

Figure 4:
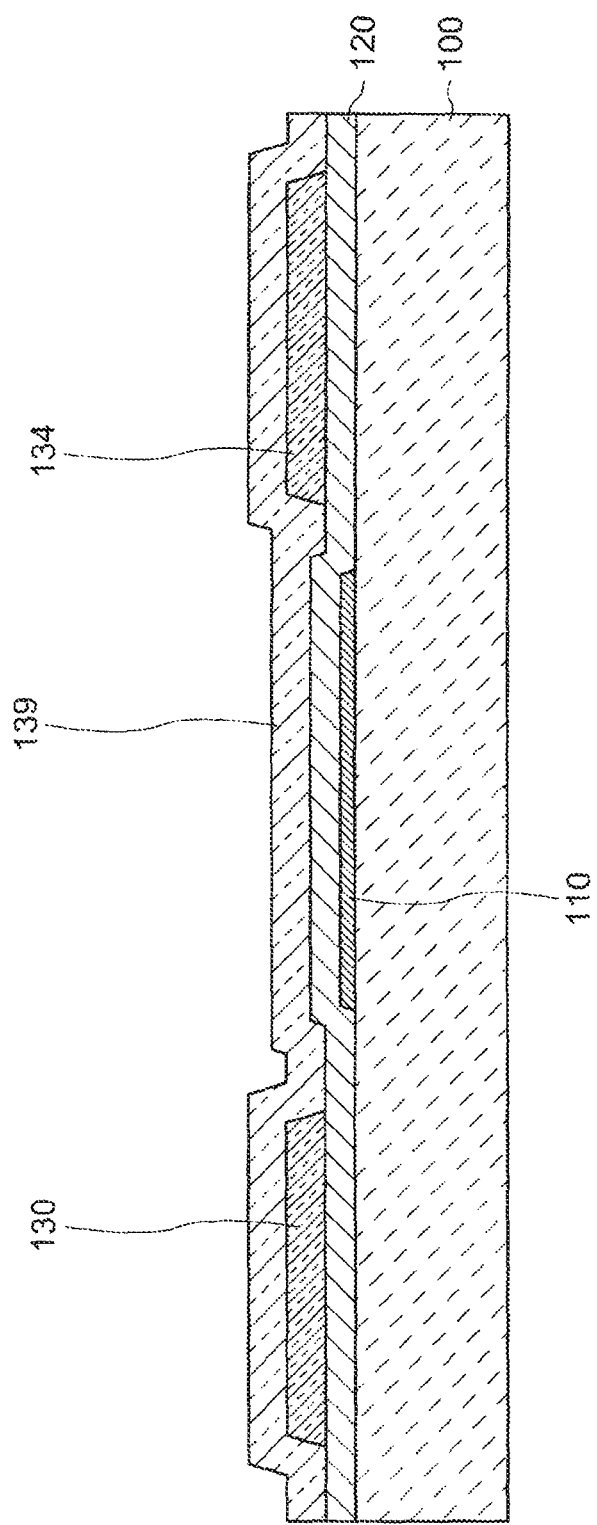
FIG. 4 is a cross-sectional diagram showing a process for forming an oxide semiconductor layer in a manufacturing method of a semiconductor device according to one embodiment of the present invention.

FIG. 4 is a cross-sectional diagram showing a process for forming an oxide semiconductor layer in the method of manufacturing a semiconductor device according to one embodiment of the present invention. As is shown in FIG. 4, an oxide semiconductor layer 139 which does not include Sn is formed above the first oxide semiconductor layer 130, the third oxide semiconductor layer 134 and the underlying insulating layer 120 which is exposed from these oxide semiconductor layers. In the present embodiment, a film of In—Ga—Zn—O which does not include Sn is formed as the oxide semiconductor layer 139 by a sputtering method.

Figure 5:
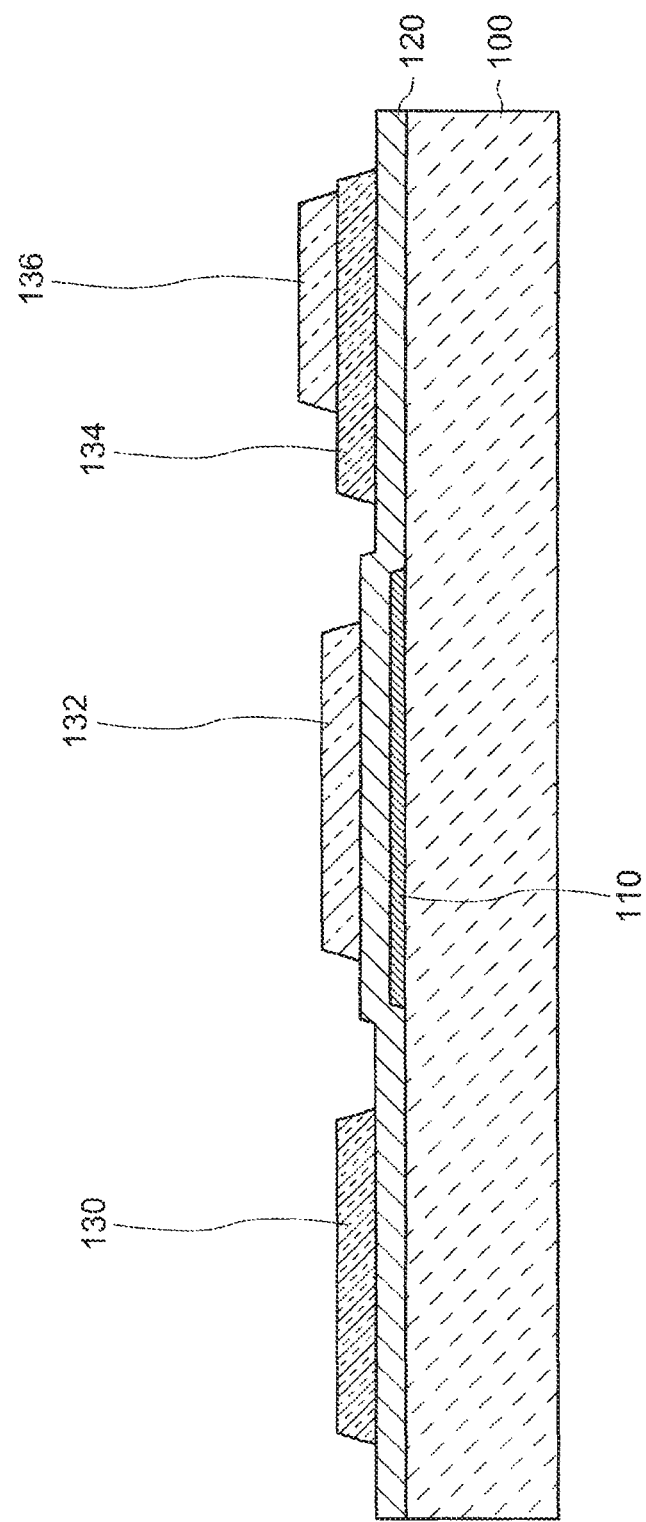
FIG. 5 is a cross-sectional diagram showing a process for forming a second oxide semiconductor layer and a fourth oxide semiconductor layer in a manufacturing method of a semiconductor device according to one embodiment of the present invention.

FIG. 5 is a cross-sectional diagram showing a process for forming a second oxide semiconductor layer and a fourth oxide semiconductor layer in the method of manufacturing a semiconductor device according to one embodiment of the present invention. Etching of the oxide semiconductor layer 139 is performed by wet etching. An etchant including phosphoric acid is used as an etchant used for the wet etching. For example, [a chemical solution using nitric acid=8 to 10%, phosphoric acid=60 to 70%, acetic acid=2 to 5%, inorganic additives ($NH_4F$ and the like)<1% and water] is used as the etchant including phosphoric acid. Since the first oxide semiconductor layer 130, the third oxide semiconductor layer 134, and the underlying insulating layer 120 have etching resistance with respect to an etchant including phosphoric acid, the first oxide semiconductor layer 130, the third oxide semiconductor layer 134, and the underlying insulating layer 120 function as etching stoppers for the oxide semiconductor layer. That is, the oxide semiconductor layer 139 is selectively etched.

As described above, since the etching resistance of the first oxide semiconductor layer 130 with respect to an etchant including phosphoric acid is different from the etching resistance of the second oxide semiconductor layer 132, it is possible to form the first oxide semiconductor layer 130 and the second oxide semiconductor layer 132 in the same layer using different materials. In other words, it is possible to form a structure in which the first oxide semiconductor layer 130 and the second oxide semiconductor layer 132 which have different materials are in contact with the same insulating layer (underlying insulating layer 120). Furthermore, it is possible to form the fourth oxide semiconductor layer 136 having a different pattern from that of the third oxide semiconductor layer 134 above the third oxide semiconductor layer 134.

A heat treatment at 250° C. or more and 450° C. or less may be performed after forming the first oxide semiconductor layer 130, the second oxide semiconductor layer 132, the third oxide semiconductor layer 134 and the fourth oxide semiconductor layer 136.

Figure 6:
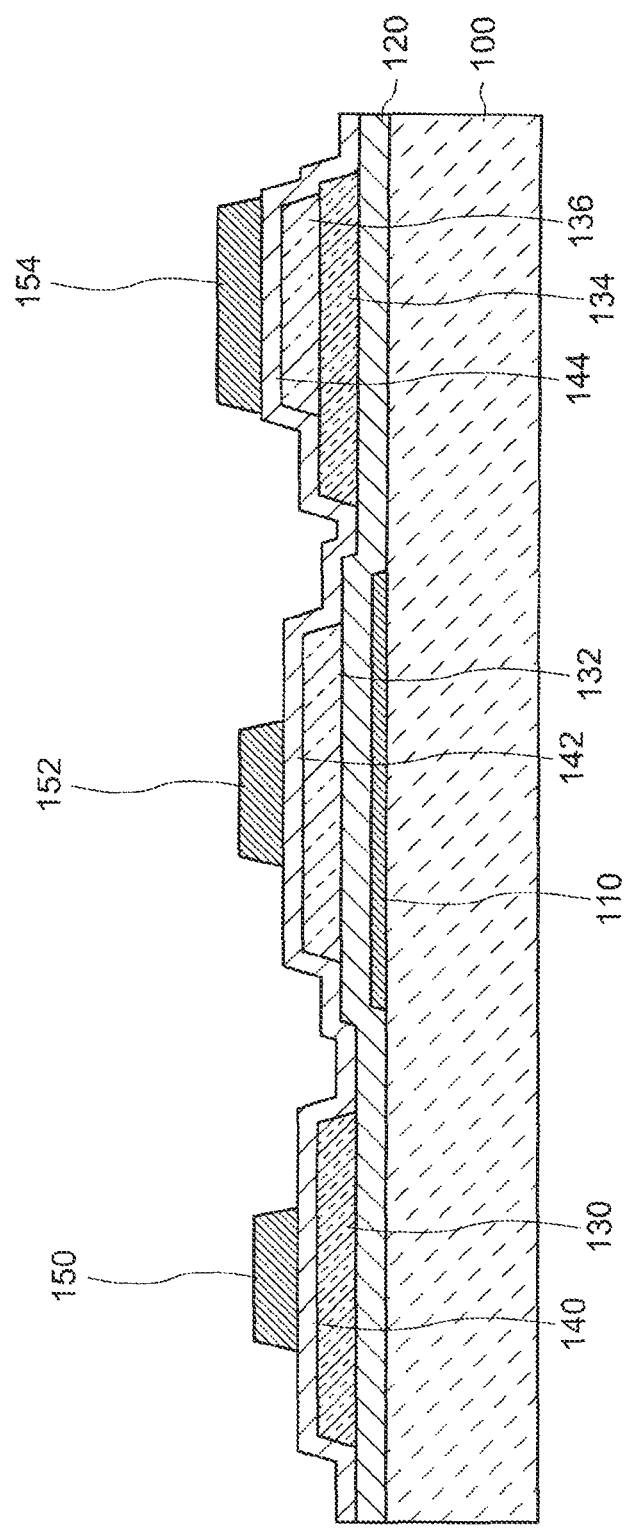
FIG. 6 is a cross-sectional diagram showing a process for forming a gate insulating layer and a gate electrode in a manufacturing method of a semiconductor device according to one embodiment of the present invention.

FIG. 6 is a cross-sectional diagram showing a process for forming a gate insulating layer and a gate electrode in the method of manufacturing a semiconductor device according to one embodiment of the present invention. As is shown in FIG. 6, an insulating layer including a first gate insulating layer 140, a second gate insulating layer 142 and a dielectric body 144, and a conducting layer including a first gate electrode 150, a second gate electrode 152 and a capacitor electrode 154 are formed over the entire surface of the structure body shown in FIG. 4, and patterns of the first gate electrode 150, the second gate electrode 152 and the capacitor electrode 154 are formed by photolithography and etching.

An interlayer insulating layer 160 is formed above the structure shown in FIG. 6. Openings 170 to 174 respectively exposing the first oxide semiconductor layer 130, the second oxide semiconductor layer 132 and the third oxide semiconductor layer 134 are formed in the interlayer insulating layer 160. In addition, it is possible to obtain the semiconductor device 10 shown in FIG. 1 by forming the first source electrode 180, the first drain electrode 181, the second source electrode 182, the second drain electrode 183 and the wiring 184 which are respectively in contact with the first oxide semiconductor layer 130, the second oxide semiconductor layer 132 and the third oxide semiconductor layer 134 via the openings 170 to 174.

In the state shown in FIG. 6, impurities may be implanted into the first oxide semiconductor layer 130, the second oxide semiconductor layer 132 and the third oxide semiconductor layer 134 from above. For example, boron (B) or phosphorus (P) may be implanted into the oxide semiconductor layers described above using an ion implantation method. In addition to the ion implantation method, impurities may be implanted into the oxide semiconductor layers described above using an ion doping method. Impurities such as argon (Ar) other than B and P may also be used as the impurities implanted into the oxide semiconductor layers described above.

As described above, according to the semiconductor device 10 according to the first embodiment, by using oxide semiconductor layers each having different etching resistances for the oxide semiconductor layers of the first transistor 20 and the second transistor 30, it is possible to form oxide semiconductor layers with different materials in same layer. Since the content ratio of Sn in the first oxide semiconductor layer 130 is higher than the content ratio of Sn in the second oxide semiconductor layer 130, the etching resistance of the first oxide semiconductor layer 130 to phosphoric acid is higher than that of the second oxide semiconductor layer. Therefore, it is possible to selectively etch the second oxide semiconductor layer 132 in the case when the first oxide semiconductor layer 130 and the second oxide semiconductor layer 132 are etched in the same process.

Second Embodiment

Figure 7:
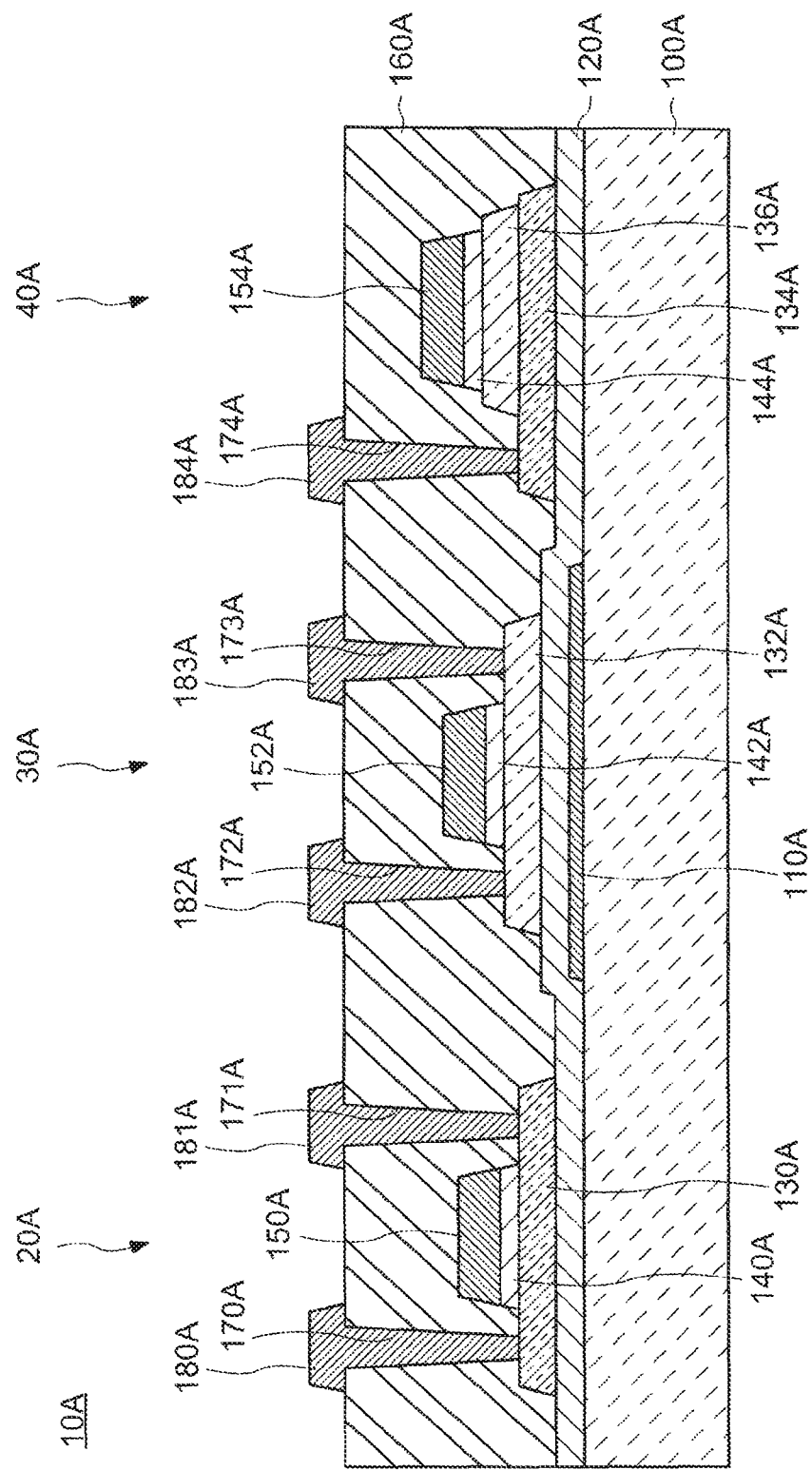
FIG. 7 is a cross-sectional diagram showing an outline of a semiconductor device according to one embodiment of the present invention.

An outline of a semiconductor device 10A according to the second embodiment of the present invention is explained using FIG. 7. The semiconductor device 10A of the second embodiment can be applied to an LCD, a self-light emitting display device, a reflection type display device or an integrated circuit or the like similar to the semiconductor device 10 of the first embodiment.

[Structure of Semiconductor Device 10A]

FIG. 7 is a cross-sectional diagram showing an outline of a semiconductor device according to one embodiment of the present invention. The semiconductor device 10A shown in FIG. 7 is similar to the semiconductor device 10 shown in FIG. 1. However, the semiconductor device 10A is different from the semiconductor device 10 in that the first gate insulating layer 140A, the second gate insulating layer 142A and the dielectric body 144A are provided only in a region which overlaps with the first gate electrode 150A, the second gate electrode 152A and the capacitor electrode 154A in a planar view. That is, the interlayer insulating layer 160A is in contact with the first oxide semiconductor layer 130A, the second oxide semiconductor layer 132A, the third oxide semiconductor layer 134A and the fourth oxide semiconductor layer 136A.

[Manufacturing Method of Semiconductor Device 10A]

The manufacturing method of the semiconductor device 10A is the same as the semiconductor device 10 from FIG. 3 to FIG. 6. In the manufacturing method of the semiconductor device 10, the first gate electrode 150, the second gate electrode 152 and the capacitor electrode 154 are etched using insulating layers (first gate insulating layer 140, second gate insulating layer 142, and the dielectric body 144) below these electrodes as an etching stopper. On the other hand, in the manufacturing method of the semiconductor device 10A, the lower insulating layers (first gate insulating layer 140A, second gate insulating layer 142A and dielectric body 144A) are also etched in an etching process of the first gate electrode 150A, second gate electrode 152A and capacitor electrode 154A to expose the first oxide semiconductor layer 130A, the second oxide semiconductor layer 132A, the third oxide semiconductor layer 134A and the fourth oxide semiconductor layer 136A. That is, a layer of the gate electrode and a layer of the gate insulating layer are collectively etched. In addition, similar to the semiconductor device 10, the interlayer insulating layer 160A is formed provided with the openings 170A to 174A, and it is possible to obtain the semiconductor device 10A shown in FIG. 7 by forming the first source electrode 180A, the first drain electrode 181A, the second source electrode 182A, the second drain electrode 183A and the wiring 184A.

Third Embodiment

An outline of a semiconductor device 10B according to the third embodiment of the present invention is explained using FIG. 8 to FIG. 11. The semiconductor device 10B according to the third embodiment can be applied to an LCD, a self-light emitting display device, a reflection type display device or an integrated circuit and the like similar to the semiconductor device 10 of the first embodiment.

[Structure of Semiconductor Device 10B]

Figure 8:
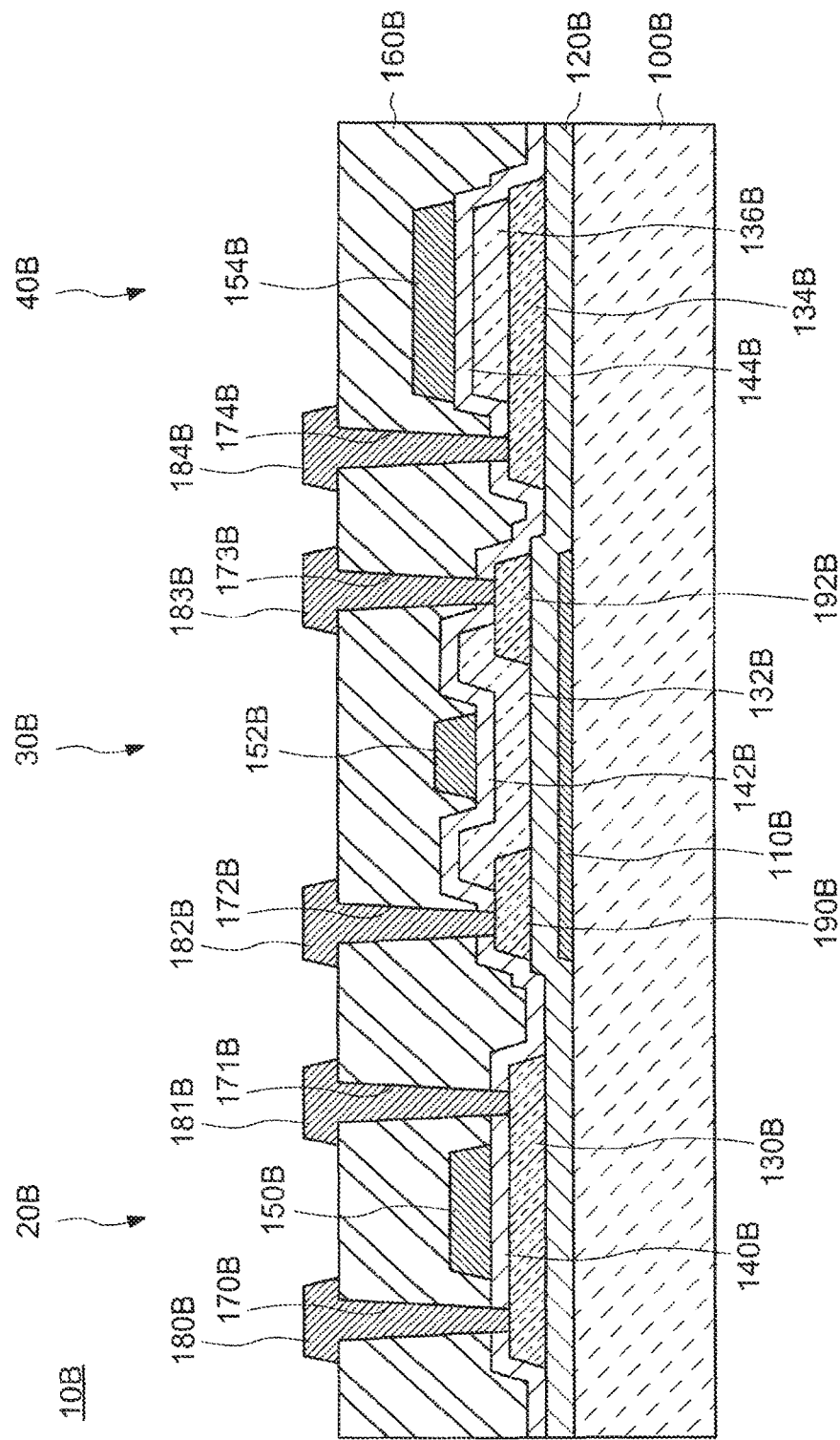
FIG. 8 is a cross-sectional diagram showing an outline of a semiconductor device according to one embodiment of the present invention.

FIG. 8 is a cross-sectional diagram showing an outline of a semiconductor device according to one embodiment of the present invention. The semiconductor device 10B shown in FIG. 8 is similar to the semiconductor device 10 shown in FIG. 1. However, the semiconductor device 10B is different from the semiconductor device 10 in that fifth oxide semiconductor layers 190B and 192B are provided between the underlying insulating layer 120B and the second oxide semiconductor layer 132B in the source region and the drain region of the second transistor 30B. The composition of the fifth oxide semiconductor layers 190B and 192B is the same as the composition of the first oxide semiconductor layer 130B. The structure of the first transistor 20B of the semiconductor device 10B and the capacitor 40B is the same as the structure of the first transistor 20 of the semiconductor device 10 and the capacitor 40.

As is shown in FIG. 8, a part of the fifth oxide semiconductor layer 190B and a part of the fifth oxide semiconductor layer 192B are respectively exposed from the second oxide semiconductor layer 132B in the source region and the drain region of the second transistor 30B. The second source electrode 182B and the second drain electrode 183B are respectively in contact with the fifth oxide semiconductor layers 190B and 192B which are exposed from the second oxide semiconductor layer 132B.

With the structure described above, since the resistance of the source region and the drain region of the second transistor 30B is reduced, an ON current of the second transistor 30B is improved.

[Manufacturing Method of Semiconductor Device 10B]

Figure 9:
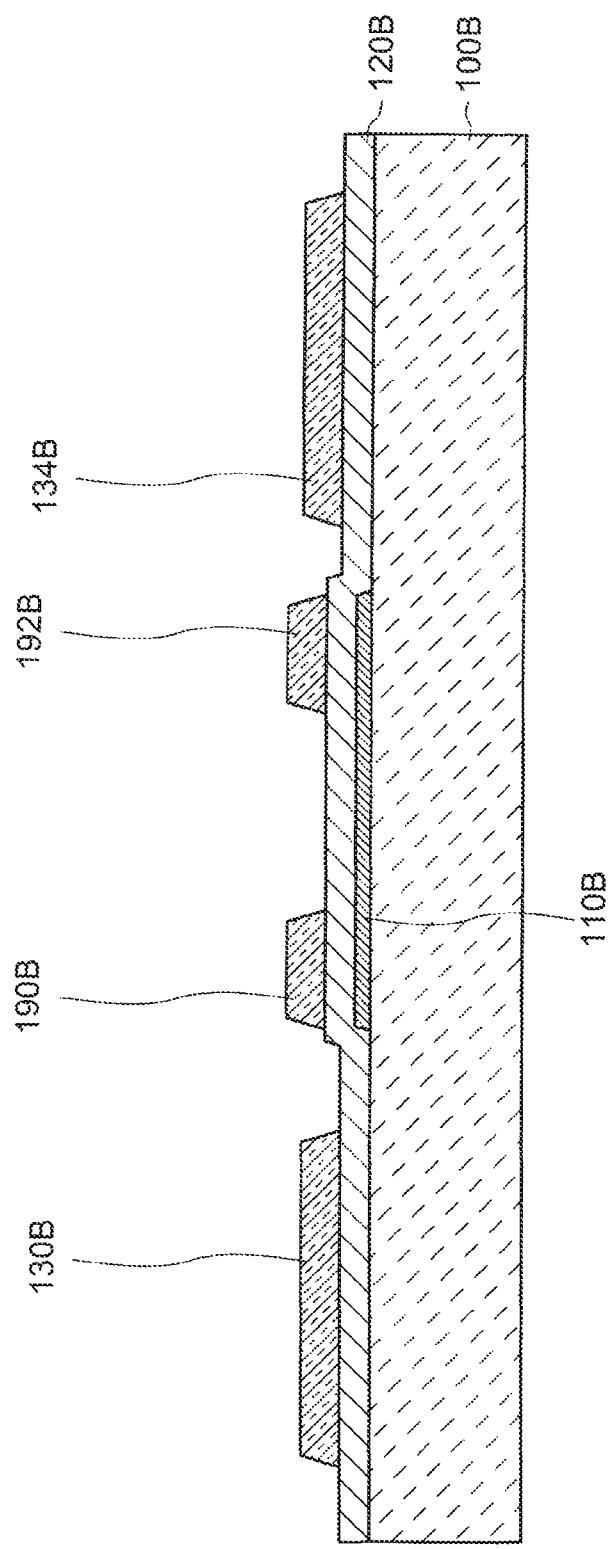
FIG. 9 is a cross-sectional diagram showing a process for forming a first oxide semiconductor layer, a third oxide semiconductor layer and a fifth oxide semiconductor layer in a manufacturing method of a semiconductor device according to one embodiment of the present invention.
Figure 10:
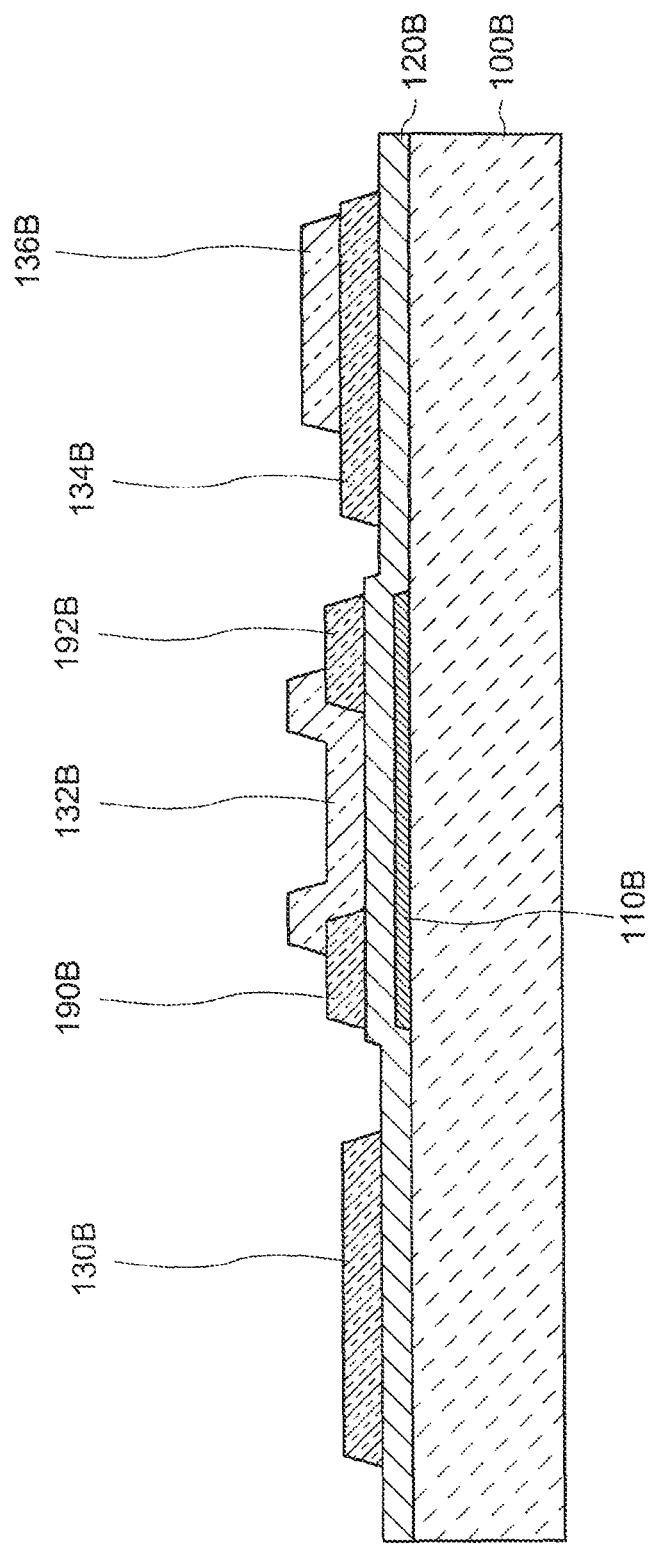
FIG. 10 is a cross-sectional diagram showing a process for forming a second oxide semiconductor layer and a fourth oxide semiconductor layer in a manufacturing method of a semiconductor device according to one embodiment of the present invention.
Figure 11:
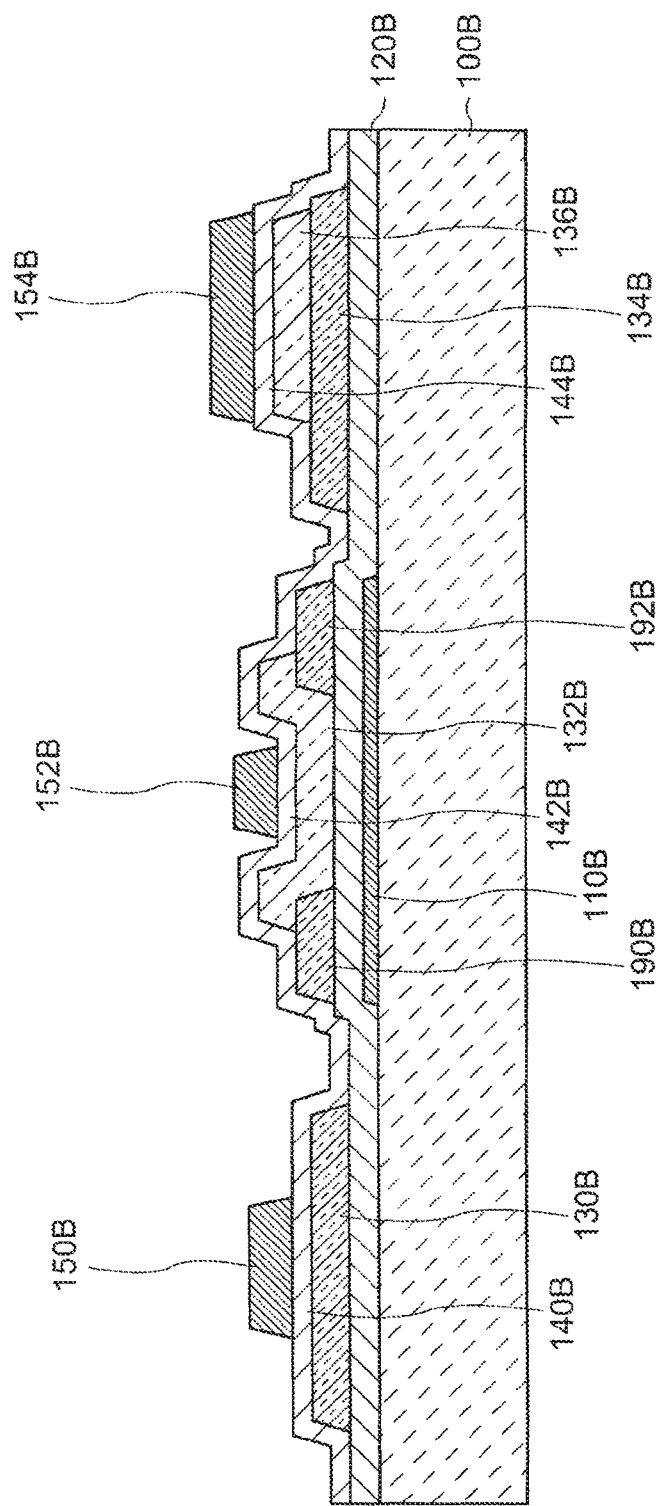
FIG. 11 is a cross-sectional diagram showing a process for forming a gate insulating layer and a gate electrode in a manufacturing method of a semiconductor device according to one embodiment of the present invention.

A method of manufacturing the semiconductor device 10B is explained using FIG. 9 to FIG. 11. FIG. 9 is a cross-sectional diagram showing a process for forming a first oxide semiconductor layer, a third oxide semiconductor layer, and a fifth oxide semiconductor layer in a method for manufacturing a semiconductor device according to one embodiment of the present invention. Although FIG. 9 is similar to FIG. 3, they are different in that the fifth oxide semiconductor layers 190B and 192B are formed at positions corresponding to the source region and drain region of the second transistor 30B.

FIG. 10 is a cross-sectional diagram showing a process for forming a second oxide semiconductor layer and a fourth oxide semiconductor layer in the method of manufacturing a semiconductor device according to one embodiment of the present invention. The second oxide semiconductor layer 132B and the fourth oxide semiconductor layer 136B are formed by the same method as in FIG. 4 and FIG. 5. A part of the second oxide semiconductor layer 132B is formed so as to overlap with the fifth oxide semiconductor layers 190B and 192B in a planar view. That is, a part of the fifth oxide semiconductor layers 190B and 192B is exposed from the second oxide semiconductor layer 132B. This exposed region is a region where the openings 172B and 173B are formed in a subsequent process.

FIG. 11 is a cross-sectional diagram showing a process for forming a gate insulating layer and a gate electrode in the method of manufacturing a semiconductor device according to one embodiment of the present invention. The first gate insulating layer 140B, the second gate insulating layer 142B and the dielectric body 144B, and the first gate electrode 150B, the second gate electrode 152B and the capacitor electrode 154B are formed by the same method as in FIG. 6. In addition, similar to the semiconductor device 10, the interlayer insulating layer 160B provided with the openings 170B to 174B is formed, and it is possible to obtain the semiconductor device 10B shown in FIG. 8 by forming the first source electrode 180B, the first drain electrode 181B, the second source electrode 182B, the second drain electrode 183B and the wiring 184B.

Fourth Embodiment

An outline of a semiconductor device 100 according to the fourth embodiment of the present invention is explained using FIG. 12 to FIG. 15. The semiconductor device 100 of the fourth embodiment can be applied to an LCD, a self-light emitting display device, a reflective display device or an integrated circuit and the like similar to the semiconductor device 10 of the first embodiment.

[Structure of Semiconductor Device 100]

Figure 12:
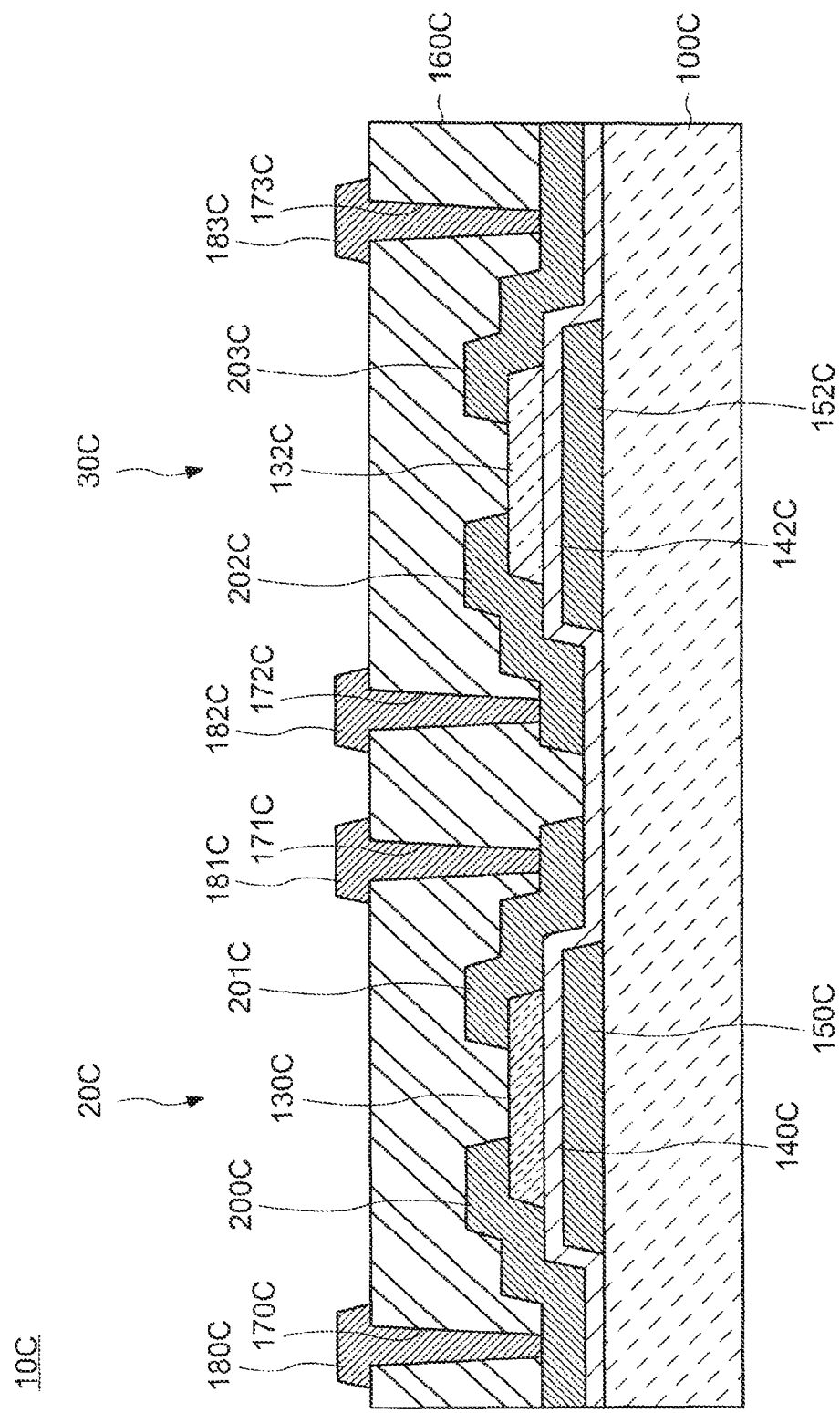
FIG. 12 is a cross-sectional diagram showing an outline of a semiconductor device according to one embodiment of the present invention.

FIG. 12 is a cross-sectional diagram showing an outline of a semiconductor device according to one embodiment of the present invention. The first transistor 20C and the second transistor 30C shown in FIG. 12 are bottom-gate type transistors. Although only the first transistor 20C and the second transistor 30C are shown in FIG. 12, a capacitor element may also be arranged similar to FIG. 1.

The first transistor 20C includes a first gate electrode 150C, a first gate insulating layer 140C, a first oxide semiconductor layer 130C, a first source electrode 200C and a first drain electrode 201C. The first gate electrode 150C is provided above the substrate 100C. An insulating layer may be provided between the substrate 100C and the first gate electrode 150C. The first gate insulating layer 140C is provided above the first gate electrode 150C. The first oxide semiconductor layer 130C is in contact with the first gate insulating layer 140C above the first gate insulating layer 140C. When describing the structure described above in other words, the first gate electrode 150C faces the first oxide semiconductor layer 130C. The first gate insulating layer 140C is provided between the first oxide semiconductor layer 130C and the first gate electrode 150C.

The second transistor 30C includes a second gate electrode 152C, a second gate insulating layer 142C, a second oxide semiconductor layer 132C, a second source electrode 202C and a second drain electrode 203C. The second gate electrode 152C is provided above the substrate 100C. An insulating layer may be provided between the substrate 100C and the second gate electrode 152C. The second gate insulating layer 142C is provided above the second gate electrode 152C. The second oxide semiconductor layer 132C is in contact with the second gate insulating layer 142C above the second gate insulating layer 142C. When describing the structure described above in other words, the second gate electrode 152C faces the second oxide semiconductor layer 132C. The second gate insulating layer 142C is provided between the second oxide semiconductor layer 132C and the second gate electrode 152C.

The first source electrode 180C is connected to the first source electrode 200C via the opening 170C. The first drain electrode 181C is connected to the first drain electrode 201C via the opening 171C. The second source electrode 182C is connected to the second source electrode 202C via the opening 172C. The second drain electrode 183C is connected to the second drain electrode 203C via the opening 173C.

[Manufacturing Method of Semiconductor Device 100]

Figure 13:
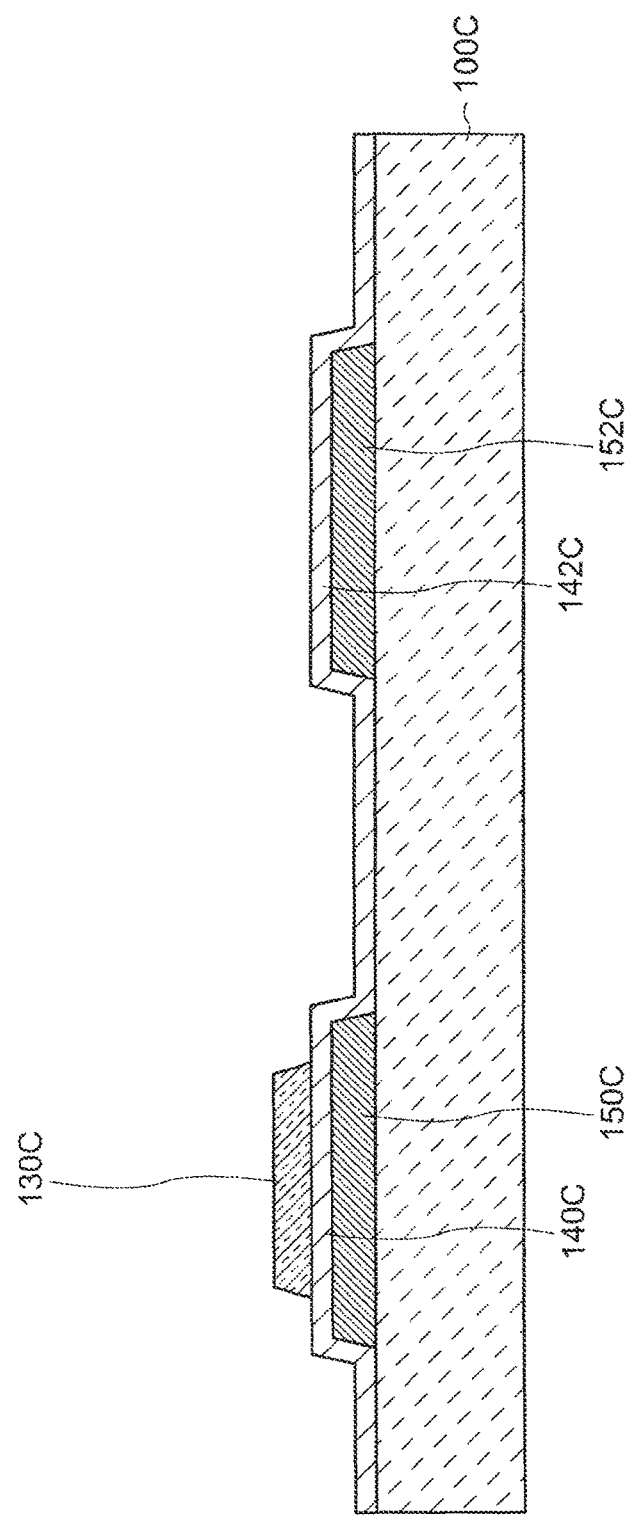
FIG. 13 is a cross-sectional diagram showing a process for forming an oxide semiconductor layer in a manufacturing method of a semiconductor device according to one embodiment of the present invention.
Figure 14:
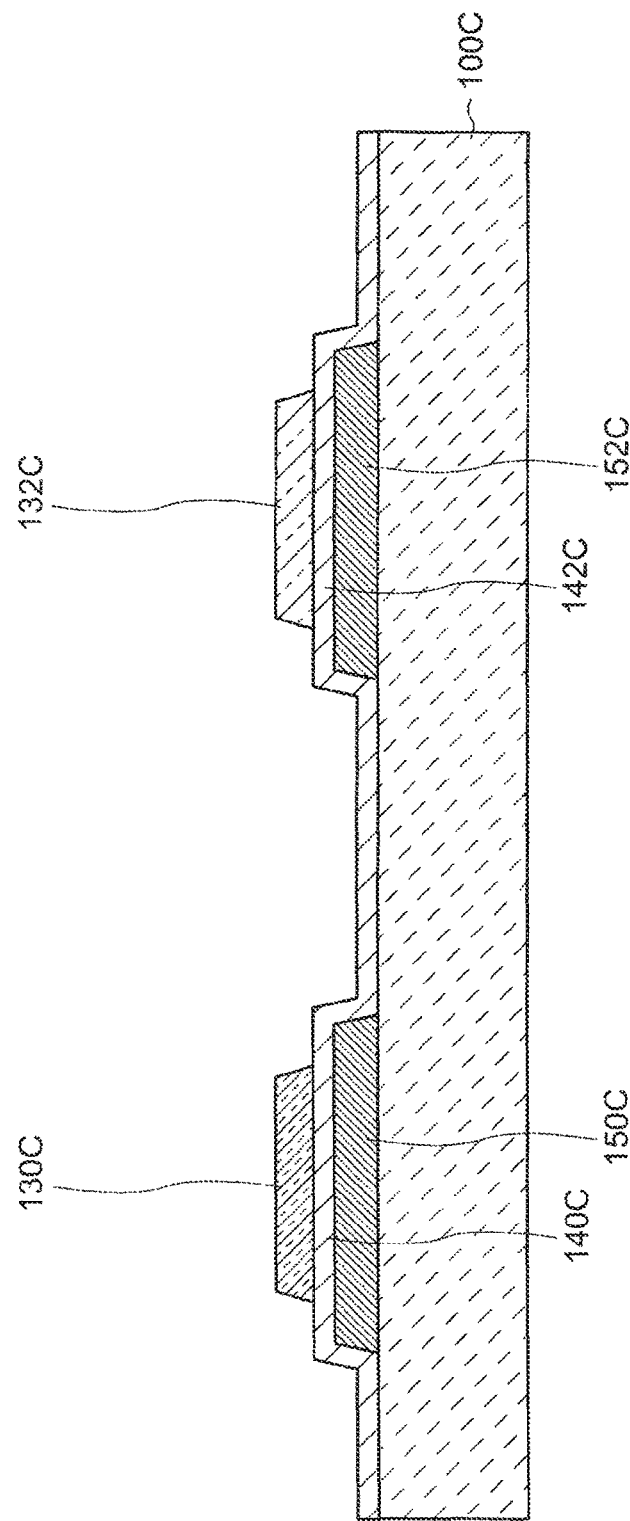
FIG. 14 is a cross-sectional diagram showing a process for forming a second oxide semiconductor layer in a manufacturing method of a semiconductor device according to one embodiment of the present invention.
Figure 15:
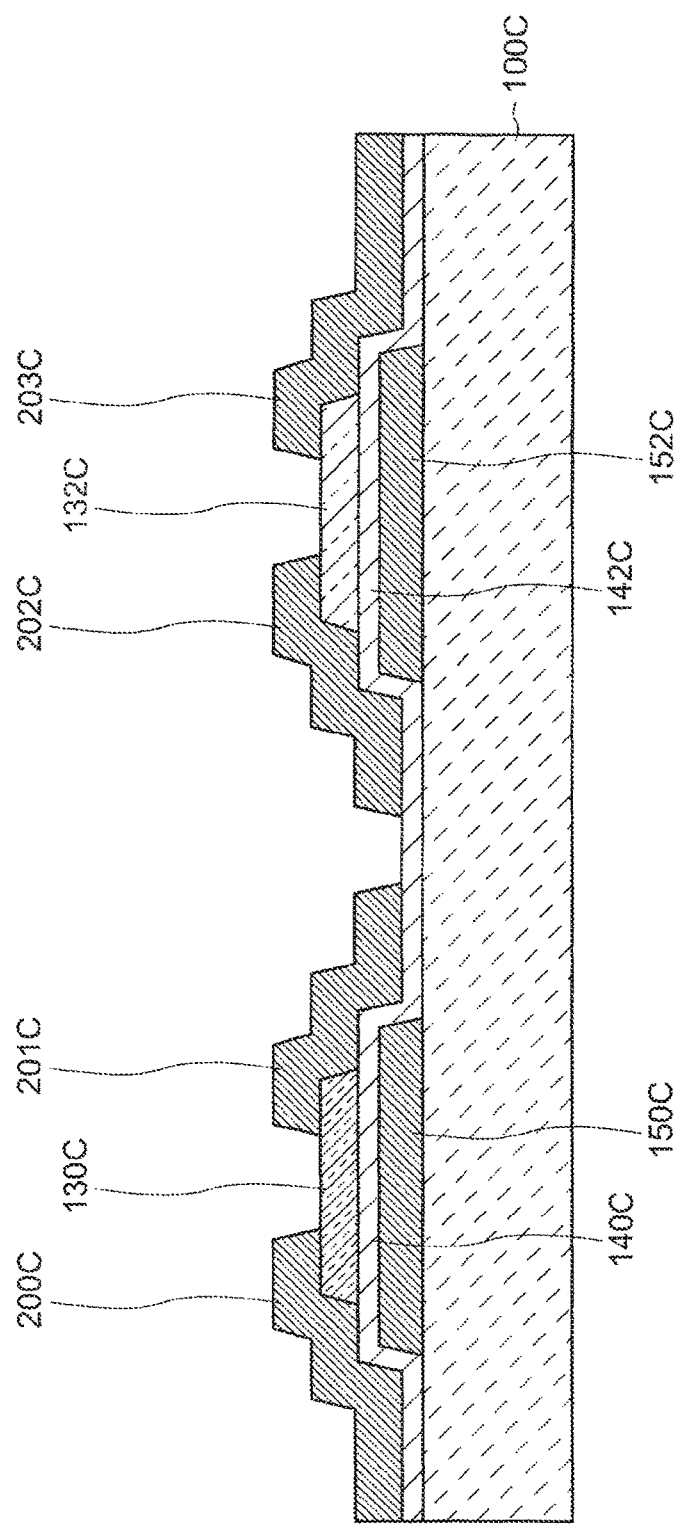
FIG. 15 is a cross-sectional diagram showing a process for forming a source electrode and a drain electrode in a manufacturing method of a semiconductor device according to one embodiment of the present invention.

A method of manufacturing the semiconductor device 100 according to the fourth embodiment of the present invention is explained while referring to the cross-sectional diagrams of FIG. 13 to FIG. 15. FIG. 13 is a cross-sectional diagram showing a process for forming a first oxide semiconductor layer in the method of manufacturing a semiconductor device according to one embodiment of the present invention. A first oxide semiconductor layer 130C is formed by the same method as in FIG. 3. The first oxide semiconductor layer 130C is formed in a region which overlaps with the first gate electrode 150C in a planar view.

FIG. 14 is a cross-sectional diagram showing a process for forming a second oxide semiconductor layer in the method of manufacturing a semiconductor device according to one embodiment of the present invention. The second oxide semiconductor layer 132C is formed by the same method as in FIG. 4 and FIG. 5. The second oxide semiconductor layer 132C is formed in a region which overlaps with the second gate electrode 152C in a planar view.

FIG. 15 is a cross-sectional diagram showing a process for forming a source electrode and a drain electrode in the method of manufacturing a semiconductor device according to one embodiment of the present invention. A conductive layer is formed with respect to the structure shown in FIG. 14, and the first source electrode 200C, first drain electrode 201C, second source electrode 202C and second drain electrode 203C shown in FIG. 15 are formed by photolithography and etching. The first oxide semiconductor layer 130C which is exposed from the first source electrode 200C and the first drain electrode 201C functions as a channel of the first transistor 20C. The second oxide semiconductor layer 132C which is exposed from the second source electrode 202C and the second drain electrode 203C functions as a channel of the second transistor 30C.

In addition, the interlayer insulating layer 160C which is provided with the openings 170C to 173C is formed, and it is possible to obtain the semiconductor device 100 shown in FIG. 12 by forming the first source electrode 180C, first drain electrode 181C, second source electrode 182C and second drain electrode 183C.

Fifth Embodiment

Figure 16:
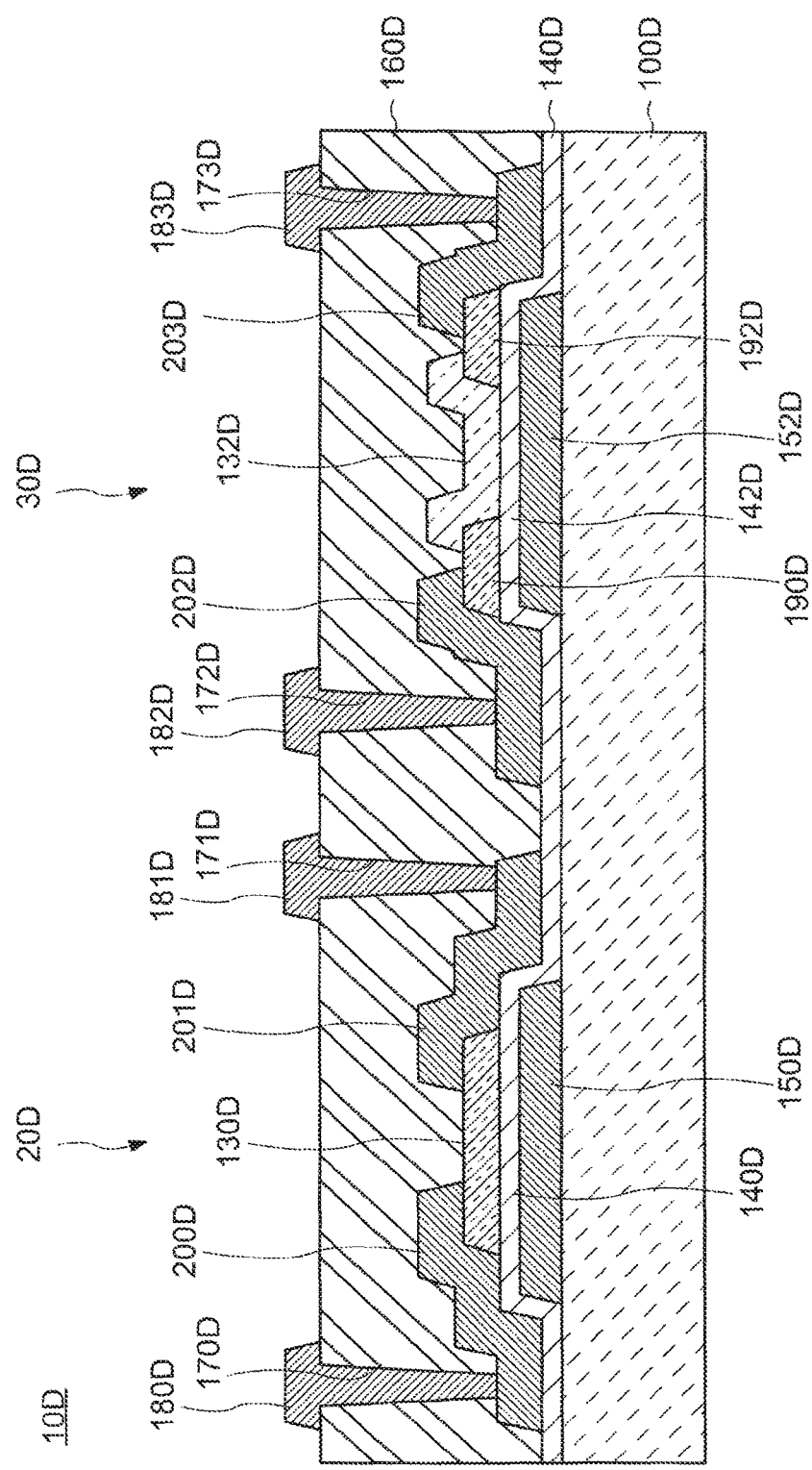
FIG. 16 is a cross-sectional diagram showing an outline of a semiconductor device according to one embodiment of the present invention.

An outline of a semiconductor device 10D according to the fifth embodiment of the present invention is explained using FIG. 16. The semiconductor device 10D of the fifth embodiment can be applied to an LCD, a self-light emitting display device, a reflective display device or an integrated circuit and the like similar to the semiconductor device 10 of the first embodiment.

[Structure of Semiconductor Device 10D]

FIG. 16 is a cross-sectional diagram showing an outline of a semiconductor device according to one embodiment of the present invention. The semiconductor device 10D shown in FIG. 16 is similar to the semiconductor device 100 shown in FIG. 12. However, the semiconductor device 10D is different from the semiconductor device 100 in that in the source region and the drain region of the second transistor 30D, fifth oxide semiconductor layers 190D and 192D are provided between a second gate insulating layer 142D and a second oxide semiconductor layer 132D. The composition of the fifth oxide semiconductor layers 190D and 192D is the same as the composition of the first oxide semiconductor layer 130D.

As is shown in FIG. 16, a part of the fifth oxide semiconductor layer 190D and a part of the fifth oxide semiconductor layer 192D are respectively exposed from the second oxide semiconductor layer 132D in the source region and the drain region of the second transistor 30D. A second source electrode 202D and a second drain electrode 203D are respectively in contact with the fifth oxide semiconductor layers 190D and 192D which are exposed from the second oxide semiconductor layer 132D.

With the structure described above, since the resistance of the source region and the drain region of the second transistor 30D is reduced, an ON current of the second transistor 30D is improved.

EXAMPLES

Evaluation results of the etching rates with respect to various etchants of the first oxide semiconductor layer 130 and the second oxide semiconductor layer 132 used in the first to fifth embodiments of the present invention, and the transistor characteristic evaluation results of the first transistor 20 and the second transistor 30 are explained below.
[Evaluation of Etching Rates with Respect to Various Etchants]

FIG. 17 is a diagram showing an etching rate for the first oxide semiconductor layer and the second oxide semiconductor layer according to one embodiment of the present invention. The evaluation of the etching rate shown in FIG. 17 was performed under the following conditions.
Sample Structure: oxide semiconductor layer (100 nm)/Si wafer
Etching Temperature: Etching was performed with a peeling solution at 40° C. and other etchants at 23° C.

Using the first oxide semiconductor layer 130 and the second oxide semiconductor layer 132 as an oxide semiconductor layer having the sample structure described above, samples immediately after each deposition (as-depo) and after heat treatment at 350° C. (350 deg C. ANL) were respectively prepared and the etching rate for each sample was evaluated.

As is shown in FIG. 17, the etching rate for the first oxide semiconductor layer 130 with respect to phosphoric acid is smaller by one order of magnitude or more compared to the etching rate for second oxide semiconductor layer 132. In particular, the first oxide semiconductor layer 130 after a heat treatment at 350° C. is hardly etched by phosphoric acid. On the other hand, with respect to oxalic acid, there is almost no difference in the etching rate for the first oxide semiconductor layer 130 from the etching rate for the second oxide semiconductor layer. In this way, when the first oxide semiconductor layer 130 and the second oxide semiconductor layer 132 are compared, since there is a large difference in etching rates with respect to phosphoric acid, in the processes of FIG. 4 and FIG. 5, it is possible to selectively etch the second oxide semiconductor layer 132.
[Evaluation of Transistor Characteristics]

FIG. 18 is a diagram showing the electrical characteristics of a first transistor and a second transistor according to one embodiment of the present invention. The transistor shown in FIG. 18 is a transistor characteristic of the bottom-gate type first transistor 20C and the second transistor 30C shown in FIG. 12. The measurement conditions of the transistor characteristics shown in FIG. 18 are as follows.
Transistor Size: W/L=8.0 μm/3.0 μm
Source-Drain Voltage: 1.0 V
Gate Voltage: −15 V to +20 V
Measurement Environment: Room Temperature, Dark Room
Number of Measured Transistors: 9

The threshold voltage (Vth) of the first transistor 20C shown in FIG. 18 is about 0.4 V, mobility is about 17.6 $cm^2$/Vs, and a S value is about 0.11 V/dec. The threshold voltage (Vth) of the second transistor 30C is about 1.0V, mobility is about 9.7 $cm^2$/Vs, and a S value is about 0.18 V/dec. In this way, the mobility and an ON current of the first transistor 20C in which the first oxide semiconductor layer 130C is used for a channel are higher than the mobility and an ON current of the second transistor 30C in which the second oxide semiconductor layer 132C is used for the channel. Therefore, it is possible to realize a drive circuit with high driving capability by using the first transistor 20C as a driving circuit.

Furthermore, the present invention is not limited to the embodiments described above and can be appropriately changed without departing from the concept of the present invention.

What is claimed is:
1. A display device comprising:
a display circuit provided with a plurality of pixel circuits in a matrix shape;
a drive circuit provided in a periphery of the display circuit, the drive circuit driving each of the plurality of pixel circuits;
a first transistor having a first oxide semiconductor layer as a channel and a first gate electrode, the first transistor being included in the drive circuit;
a second transistor having a second oxide semiconductor layer as a channel and a second gate electrode, the second transistor being included in the pixel circuit, and a composition of the first oxide semiconductor layer is different from a composition of the second oxide semiconductor layer,
wherein
the first oxide semiconductor layer and the second oxide semiconductor layer include Sn, and
a content ratio of the Sn included in the first oxide semiconductor layer is more than a content ratio of the Sn included in the second oxide semiconductor layer.
2. The display device according to claim 1, further comprising a first insulating layer provided below the first transistor and the second transistor,
wherein
the first oxide semiconductor layer is in contact with the first insulating layer above the first insulating layer, and
the second oxide semiconductor layer is in contact with the first insulating layer above the first insulating layer.
3. The display device according to claim 2, further comprising a second insulating layer being in contact with the first oxide semiconductor layer above the first oxide semiconductor layer, and being in contact with the second oxide semiconductor layer above the second oxide semiconductor layer.
4. The display device according to claim 3, wherein
the pixel circuit further includes a capacitor element having a first electrode and a second electrode facing the first electrode,
the first electrode is provided above the first insulating layer and includes a stacked oxide semiconductor layer,
the stacked oxide semiconductor includes a third oxide semiconductor layer and a fourth oxide semiconductor layer stacked with the third oxide semiconductor layer,
the third oxide semiconductor layer has the same composition and is the same layer as the first oxide semiconductor layer,
the fourth oxide semiconductor layer has the same composition and is the same layer as the second oxide semiconductor layer,
the second electrode is provided in the same layer as the first gate electrode.
5. The display device according to claim 4, wherein
the third oxide semiconductor layer is in contact with the first insulating layer above the first insulating layer, and the fourth oxide semiconductor layer is in contact with the third oxide semiconductor layer above the third oxide semiconductor layer.

6. The display device according to claim 1, wherein
each of the first oxide semiconductor layer and the second oxide semiconductor layer are single-layer.

7. A display device comprising:
a display circuit provided with a plurality of pixel circuits in a matrix shape;
a drive circuit provided in a periphery of the display circuit, the drive circuit driving each of the plurality of pixel circuits;
a first transistor having a first oxide semiconductor layer as a channel and a first gate electrode, the first transistor being included in the drive circuit;
a second transistor having a second oxide semiconductor layer as a channel and a second gate electrode, the second transistor being included in the pixel circuit, and a composition of the first oxide semiconductor layer is different from a composition of the second oxide semiconductor layer,
wherein
the first oxide semiconductor layer includes Sn, and
the second oxide semiconductor layer does not include Sn.

8. The display device according to claim 7, wherein
each of the first oxide semiconductor layer and the second oxide semiconductor layer are single-layer.

* * * * *